United States Patent
Jun et al.

(10) Patent No.: US 6,800,863 B2
(45) Date of Patent: Oct. 5, 2004

(54) METHOD FOR MONITORING AN ION IMPLANTER AND ION IMPLANTER HAVING A SHADOW JIG FOR PERFORMING THE SAME

(75) Inventors: Chung-Sam Jun, Suwon-si (KR); Sun-Yong Choi, Seongnam-si (KR); Dong-Chun Lee, Gyeonggi-do (KR); Tae-kyoung Kim, Yongin-si (KR); Doo-Guen Song, Suwon-si (KR); Seung-Won Chae, Yongin-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/634,756

(22) Filed: Aug. 6, 2003

(65) Prior Publication Data

US 2004/0099818 A1 May 27, 2004

(30) Foreign Application Priority Data

Nov. 26, 2002 (KR) ................................. 10-2002-0074043

(51) Int. Cl.$^7$ ......................... H01J 37/317; H01J 37/00
(52) U.S. Cl. ............................. 250/492.21; 250/492.2; 250/492.3; 250/491.1; 250/423 R; 250/396 R; 250/398
(58) Field of Search ......................... 250/492.21, 492.2, 250/492.3, 491.1, 423 R, 396 R, 398

(56) References Cited

U.S. PATENT DOCUMENTS

| 5,343,047 | A | | 8/1994 | Ono et al. ............. 250/492.21 |
| 5,641,969 | A | | 6/1997 | Cooke et al. .......... 250/492.21 |
| 6,555,832 | B1 | * | 4/2003 | Ryding et al. ......... 250/492.21 |
| 6,566,661 | B1 | * | 5/2003 | Mitchell ..................... 250/489 |
| 6,690,022 | B2 | * | 2/2004 | Larsen et al. .......... 250/492.21 |

* cited by examiner

Primary Examiner—Nikita Wells
(74) Attorney, Agent, or Firm—Lee & Sterba, P.C.

(57) ABSTRACT

A method for monitoring an ion implanter includes positioning a substrate behind an interceptor for intercepting a portion of an ion beam to be irradiated toward the substrate, irradiating a first ion beam toward the substrate to form a first shadow on the substrate, rotating the substrate about a central axis of the substrate, irradiating a second ion beam toward the substrate to form a second shadow on the substrate, and measuring a dosage of ions implanted into the substrate to monitor whether the rotation of the substrate has been normally performed. Preferably, a dosage of ions implanted into the substrate is calculated from a thermal wave value of the substrate and whether the rotation of the substrate has been normally performed is monitored by comparing the thermal wave value corresponding to the first shadow with a reference thermal wave value.

40 Claims, 8 Drawing Sheets

METHOD FOR MONITORING AN ION IMPLANTER AND ION IMPLANTER HAVING A SHADOW JIG FOR PERFORMING THE SAME

BACKGROUND OF THE INVENTION

1. Field of the Invention

The present invention relates to an ion implanter for use in connection with a semiconductor substrate. More particularly, the present invention relates to a method for monitoring an ion implanter and ion implanter having a shadow jig for performing the same.

2. Description of the Related Art

Generally, semiconductor devices are manufactured through a three-step process. First, a fabricating process is performed for forming an electrical circuit on a silicon wafer used as a semiconductor substrate. Second, an inspecting process is performed for inspecting electrical characteristics of semiconductor devices formed on the semiconductor substrate. Third, a packaging process is performed for packaging the semiconductor devices in epoxy resins and individuating the semiconductor devices.

The fabricating process may include a film deposition process for forming a specific film on the semiconductor substrate, a chemical and mechanical polishing (CMP) process for planarizing a surface of the film, a photolithography process for forming photoresist patterns on the film, an etching process for forming the film into patterns having the electrical characteristics using the photoresist patterns, an ion implantation process for implanting specific ions into specific portions of the semiconductor substrate, a cleaning process for removing impurities remaining on the semiconductor substrate, an inspecting process for inspecting the film and patterns formed on the semiconductor substrate, or other similar processes.

An ion implantation process is performed to form a source and a drain of a transistor by implanting specific ions into specific portions of a semiconductor substrate. As compared with a thermal diffusing process, the ion implantation process has an advantage in that a dosage of ions implanted into semiconductor substrate and an implantation depth of ions are adjustable.

The specific ions may not be uniformly implanted into semiconductor substrate because of a channeling effect due to a crystal structure of silicon, which composes the semiconductor substrate. Accordingly, the semiconductor substrate should be positioned at a predetermined angle (i.e., tilted) with respect to a direction of an ion beam.

During the ion implantation process, an ion source irradiates an ion beam onto the semiconductor substrate in a horizontal direction, and the semiconductor substrate is tilted at an angle of approximately 7° with respect to a vertical plane ("tilted angle"). A gate pattern of a transistor formed on the semiconductor substrate and the tilted angle of semiconductor substrate cause a shadow effect on a side portion of the gate pattern.

In order to compensate for this shadow effect, a method of rotating semiconductor substrate by steps during the ion implantation process has been suggested. For example, the ions are primarily implanted into the semiconductor substrate. Then, the semiconductor substrate is rotated by a rotating angle of 180° ("rotating angle"), and the ions are secondarily implanted into the semiconductor substrate.

When the rotation of the semiconductor substrate is not normally performed due to a mechanical failure of the ion implanter, the ion implantation process is repeatedly performed at the same rotating angle. As a result, the shadow is more pronounced on the side portion of the gate pattern, and the shadow causes operational defects and degradation of the transistor.

The shadow is not detected in a typical inspecting process because a width of the shadow is extremely narrow. For example, when a height of the gate pattern is approximately 4500, the width of the shadow is approximately 55 nm. A thermal wave measuring apparatus for a dosage of ions implanted into the semiconductor substrate uses a laser beam having a spot size greater than 1 $\mu$m. Accordingly, the thermal wave measuring apparatus cannot detect the shadow. In addition, the shadow cannot be detected in an image analysis process using a scanning electron microscope (SEM) or an ingredient analysis process using a particle analyzing system.

Because the above-mentioned problems cannot be detected immediately after the ion implantation process, the above-mentioned problems are not detected until the operational defects and the degradation of the transistor are observed in the inspecting process for inspecting electrical characteristics of semiconductor devices formed on the semiconductor substrate after the fabricating process. The above-mentioned problems cause a loss of time and materials, and deteriorate the productivity of the semiconductor devices. In addition, because the manufacturing processes of the semiconductor devices are typically performed by the run, the loss corresponding to a rotation error of the semiconductor substrate in the ion implantation process may be multiplied.

SUMMARY OF THE INVENTION

In order to overcome at least some of the above-mentioned problems, the present invention provides a method for monitoring an ion implanter, which can monitor whether a rotation of the semiconductor substrate has been normally performed during an ion implantation process.

In addition, the present invention provides an ion implanter having a shadow jig for performing the method for monitoring an ion implanter.

According to an embodiment of the present invention, a method for monitoring an ion implanter includes positioning a substrate behind an interceptor for intercepting a portion of an ion beam to be irradiated toward the substrate, irradiating a first ion beam toward the substrate to form a first shadow on the substrate, rotating the substrate about a central axis of the substrate, irradiating a second ion beam toward the substrate to form a second shadow on the substrate, and measuring a dosage of ions implanted into the substrate to monitor whether the rotation of the substrate has been normally performed.

According to another embodiment of the present invention, a method for monitoring an ion implanter includes interposing an interceptor for intercepting a portion of an ion beam to be irradiated toward a substrate between the substrate and an ion source for irradiating the ion beam, irradiating a first ion beam toward the substrate to form a first shadow on the substrate, rotating the substrate about a central axis of the substrate, irradiating a second ion beam toward the substrate to form a second shadow on the substrate, and measuring a dosage of ions implanted into the substrate to monitor whether the rotation of the substrate has been normally performed.

According to still another embodiment of the present invention, a method for monitoring an ion implanter includes interposing an interceptor for intercepting a portion of an ion beam to be irradiated toward a substrate between the substrate and an ion source for irradiating the ion beam, the substrate being tilted at a predetermined angle with respect to an advancing direction of the ion beam, irradiating a first ion beam toward the substrate to form a first shadow on the substrate, rotating the substrate about a central axis of the substrate with maintenance of the tilted angle, irradiating a second ion beam toward the substrate to form a second shadow on the substrate, measuring a thermal wave value of a surface of the substrate, and comparing a first thermal wave value corresponding to the first shadow with a reference thermal wave value to monitor whether the rotation of the substrate has been normally performed.

Preferably, the ion beam is irradiated toward the substrate in a horizontal direction, and the substrate is tilted at a predetermined angle with respect to an advancing direction of the ion beam.

The dosage of ions implanted into the substrate may be measured using a method of measuring a thermal wave value of a surface of the semiconductor substrate, an image analysis method using a scanning electron microscope, an ingredient analysis method using a particle analyzing system, or an energy analysis method measuring a surface resistance of the semiconductor substrate. Preferably, the dosage of ions implanted into the substrate is measured using a method of measuring a thermal wave value of a surface of the semiconductor substrate.

According to yet another embodiment of the present invention, an ion implanter includes an ion source for irradiating an ion beam toward a substrate, an ion implantation chamber connected to the ion source for performing an ion implantation process on the substrate, a chuck disposed in the ion implantation chamber for supporting the substrate, which is tilted at a predetermined angle with respect to an advancing direction of the ion beam, a first driving unit for rotating the substrate about a central axis of the substrate in order to change an incidence angle of ion beam, and a shadow jig for intercepting a portion of the ion beam in order to form a shadow on the substrate during the ion implantation process, wherein the shadow is formed to monitor whether the substrate has been normally rotated during the ion implantation process.

Preferably, the ion implanter additionally includes a driving unit for adjusting the angle at which the substrate is tilted and a driving unit for moving the chuck in a vertical direction. In addition, the ion implanter preferably includes a driving unit connected to a bracket for moving the shadow jig, wherein the second driving unit moves the shadow jig away from a central portion of the chuck while the substrate is loaded on or unloaded from the chuck, and the second driving unit moves the shadow jig toward a central portion of the chuck for forming the shadow on the substrate during the ion implantation process.

Alternatively, the ion implanter may include a driving unit connected to a bracket for moving the shadow jig, wherein the second driving unit rotates the shadow jig in the vertical direction while the substrate is loaded on or unloaded from the chuck, and the second driving unit rotates the shadow jig back in the horizontal direction for forming the shadow on the substrate during the ion implantation process.

According to the present invention, defects in the ion implantation process caused by a rotation error of the semiconductor substrate can be prevented in advance, and the loss of time and materials can be reduced.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DESCRIPTION OF THE PREFERRED EMBODIMENTS

Korean Patent Application No. 2002-74043, filed on Nov. 26, 2002, and entitled: "Method for Monitoring an Ion Implanter and Ion Implanter Having a Shadow Jig for Performing the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
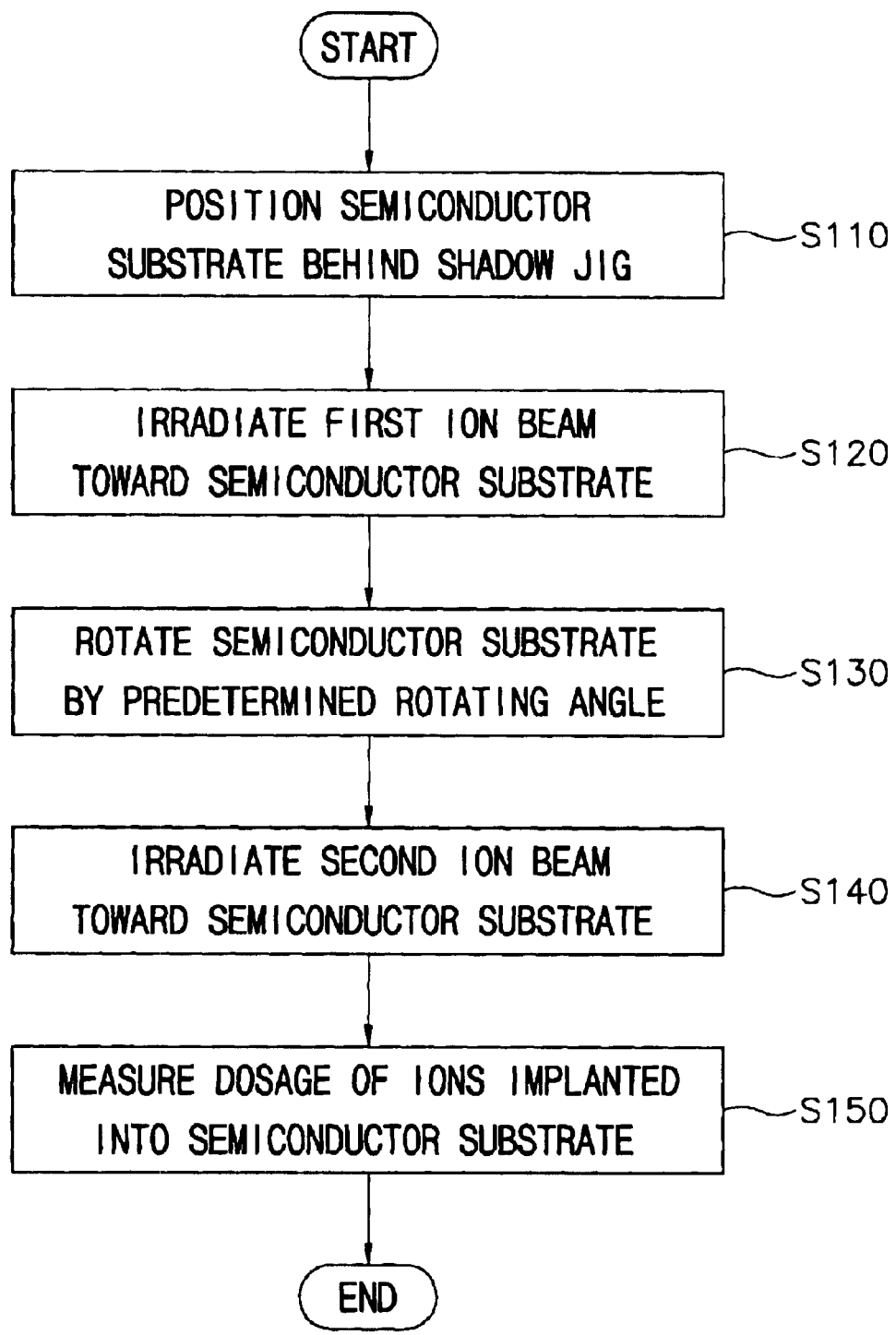
FIG. 1 is a flow chart illustrating a method for monitoring an ion implanter according to a first exemplary embodiment of the present invention.

FIG. 1 is a flow chart illustrating a method for monitoring an ion implanter according to a first exemplary embodiment of the present invention.

Referring to FIG. 1, in step S110, a semiconductor substrate is positioned behind a shadow jig on a chuck. The shadow jig is disposed at a peripheral portion of the chuck for supporting the semiconductor substrate. The chuck includes a platen for holding the semiconductor substrate using an electrostatic force, and a supporting member for supporting the platen. The platen has a disc shape. A groove for receiving the platen is formed in one side of the supporting member. The shadow jig is disposed over a peripheral portion of the semiconductor substrate. More specifically, the semiconductor substrate is positioned behind the shadow jig so that the shadow jig can intercept a portion of an ion beam to be irradiated toward the semiconductor substrate.

In step S120, a first ion beam is irradiated toward the semiconductor substrate so that a first shadow is formed on the semiconductor substrate by the shadow jig. The first shadow is formed at a peripheral portion of the semiconductor substrate and is invisible to the naked eye. A portion of the first ion beam is intercepted by the shadow jig and a remaining portion of the first ion beam is irradiated onto the semiconductor substrate. The first shadow represents a portion onto which the first ion beam is not irradiated during a primary ion implantation process. If patterns having an electrical characteristic are previously formed on the semiconductor substrate, it is preferable that the first shadow does not invade that portion on which the patterns are formed.

The ion beam is irradiated in a horizontal direction toward the semiconductor substrate, and the semiconductor substrate is tilted at a predetermined angle ("tilted angle") with respect to an advancing direction of the ion beam. The semiconductor substrate preferably has a tilted angle of approximately 7° with respect to a vertical plane, and an incidence angel of the ion beam is approximately 83° with respect to the semiconductor substrate. When the ion beam has a cross-sectional area smaller than an area of the semiconductor substrate, the ion beam scans the semiconductor substrate in the horizontal direction, and the semiconductor substrate moves in a vertical direction according to a scanning of the ion beam. When the ion beam has a cross-section of a ribbon shape extending in a horizontal direction intersecting the advancing direction of the ion beam at right angles, the semiconductor substrate moves in a vertical direction so that the ion beam entirely scans the semiconductor substrate. In the alternative, the ribbon ion beam may scan the semiconductor substrate in the vertical direction. Various scanning methods may be used in the ion implantation process.

In step S130, the semiconductor substrate having the first shadow is rotated about a central axis of the semiconductor substrate by a predetermined rotating angle (e.g., 180°). The rotating angle of the semiconductor substrate can be varied according to the patterns formed on the semiconductor substrate.

In step S140, a second ion beam is irradiated toward the semiconductor substrate so that a second shadow is formed by the shadow jig on the semiconductor substrate. The second shadow is formed opposite to the first shadow on the semiconductor substrate and is invisible to the naked eye.

In step S150, whether the rotation of the semiconductor substrate has been normally performed is monitored by measuring a dosage of ions implanted into the semiconductor substrate. The dosage of ions implanted into the semiconductor substrate can be measured by various methods. Examples of the various methods for measuring the dosage of ions include a method of measuring a thermal wave value of a surface of the semiconductor substrate, an image analysis method using a scanning electron microscope, an ingredient analysis method using a particle analyzing system, and an energy analysis method measuring a surface resistance of the semiconductor substrate. Preferably, the method measuring the thermal wave value is used.

The thermal wave value indicates a degree that the surface of the semiconductor substrate has been damaged by the implanted ions. The thermal wave value increases in proportion to the damage degree of the semiconductor substrate. That is, the thermal wave value increases in proportion to energy of the implanted ions, the dosage of the implanted ions, and an atomic mass unit (AMU) of the implanted ions. The thermal wave value is measured by a thermal probe apparatus. The thermal probe apparatus directs a laser beam onto the surface of the semiconductor substrate, detects a laser beam reflected from the surface of the semiconductor substrate, and measures the thermal wave value from a reflectivity of the surface of the semiconductor substrate.

When the rotation of the semiconductor substrate is normally performed, first and second shadows are formed on the semiconductor substrate. When the rotation of the semiconductor substrate is not normally performed due to a mechanical failure of the ion implanter, only the first shadow is formed on the semiconductor substrate. More specifically, the first and second shadows overlap each other because the semiconductor substrate has not been rotated. In addition, when the rotating of the semiconductor substrate has not been normally performed, a first thermal wave value corresponding to the first shadow portion is significantly lower than the remaining portions.

The method for monitoring an ion implanter according to a first exemplary embodiment of the present invention can be employed for the semiconductor substrates having patterns or a bare silicon wafer. In the ion implantation process performed by the run, when the method for monitoring an ion implanter is applied to a first semiconductor substrate, stable performance of the ion implantation process concerning the remaining the semiconductor substrates can be ensured. In addition, before the ion implantation process is performed by the run, when the method for monitoring an ion implanter is applied to the bare silicon wafer, stable performance of the ion implantation process concerning all the semiconductor substrates of the run can be ensured.

Figure 2:
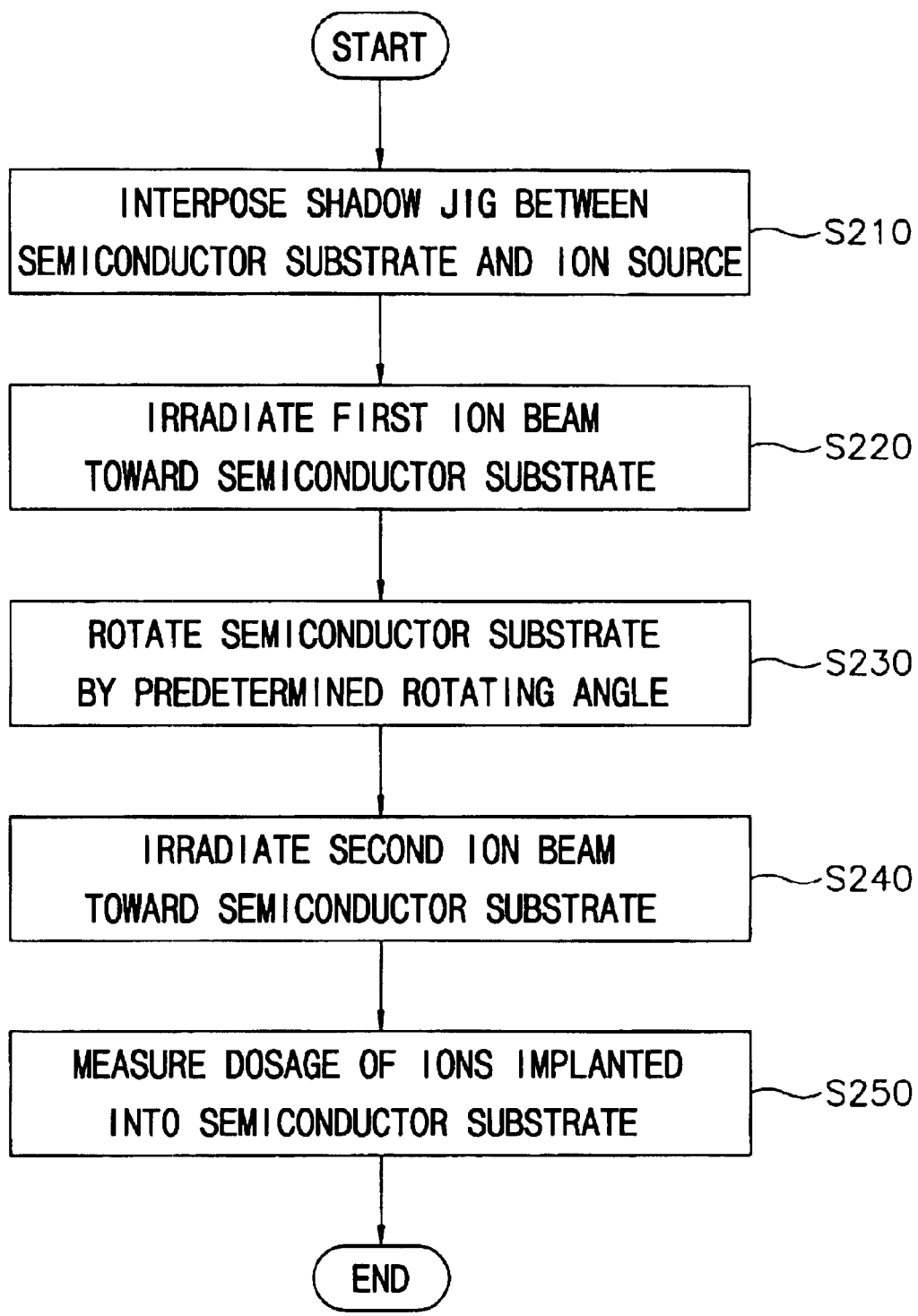
FIG. 2 is a flow chart illustrating a method for monitoring an ion implanter according to a second exemplary embodiment of the present invention.

FIG. 2 is a flow chart illustrating a method for monitoring an ion implanter according to a second exemplary embodiment of the present invention.

Referring to FIG. 2, in step S210, a shadow jig for intercepting a portion of an ion beam to be irradiated toward a semiconductor substrate is interposed between the semiconductor substrate supported by a chuck and an ion source for irradiating the ion beam. The chuck includes a platen for holding the semiconductor substrate using an electrostatic force, and a supporting member for supporting the platen. The shadow jig is movably connected at a peripheral portion of the chuck. The shadow jig is moved away from a central portion of the chuck while the semiconductor substrate is loaded on or unloaded from the chuck, and the shadow jig is moved toward a central portion of the chuck for forming the shadow on the semiconductor substrate during an ion implantation process.

In step S220, a first ion beam is irradiated toward the semiconductor substrate so that a first shadow is formed on the semiconductor substrate by the shadow jig. The shadow jig is disposed over a peripheral portion of the semiconductor substrate, and the first shadow is formed at the peripheral portion of the semiconductor substrate. It is preferable that the first shadow is formed at an edge exposure of wafer (EEW) portion of the semiconductor substrate. The EEW portion indicates a peripheral portion that a photoresist film is partly removed along the peripheral portion of the semiconductor substrate in a photolithography process for forming photoresist patterns.

In step S230, the semiconductor substrate having the first shadow is rotated about a central axis of the semiconductor substrate by a predetermined rotating angle (e.g., 180°). The rotating angle of the semiconductor substrate can be varied according to a shape of patterns formed on the semiconductor substrate.

In step S240, a second ion beam is irradiated toward the semiconductor substrate so that a second shadow is formed by the shadow jig on the semiconductor substrate. When the rotating angle is approximately 180°, the second shadow is formed opposite to the first shadow on the semiconductor substrate.

In step S250, a dosage of ions implanted into semiconductor substrate is calculated from a thermal wave value measured by a thermal probe apparatus, and whether the rotation of the semiconductor substrate has been normally performed is monitored from the measured thermal wave value.

When the rotation of the semiconductor substrate is normally performed, first and second shadows are formed on the semiconductor substrate. When the rotation of the semiconductor substrate is not normally performed due to a mechanical failure of the ion implanter, only the first shadow is formed on the semiconductor substrate. Accordingly, whether the rotation of the semiconductor substrate has been normally performed can be monitored by comparing a first thermal wave value corresponding to the first shadow with a predetermined reference thermal wave value. A thermal wave value obtained through a normal ion implantation process can be used as the reference thermal wave value. In the alternative, a thermal wave value obtained through an abnormal ion implantation process may be used as the reference thermal wave value.

A resolution of the thermal probe apparatus does not limit the scope of the present invention because areas of the first and second shadows can be varied according to a size of the shadow jig. Monitoring whether the rotation of the semiconductor substrate has been normally performed can be performed by a scanning electron microscope or a particle analyzing system.

The method for monitoring an ion implanter according to the second exemplary embodiment of the present invention can be employed for a semiconductor substrate having electrical patterns or a bare silicon wafer. The second exemplary embodiment of the present invention is able to ensure the stable performance and reliability of the ion implantation process.

Figure 3:
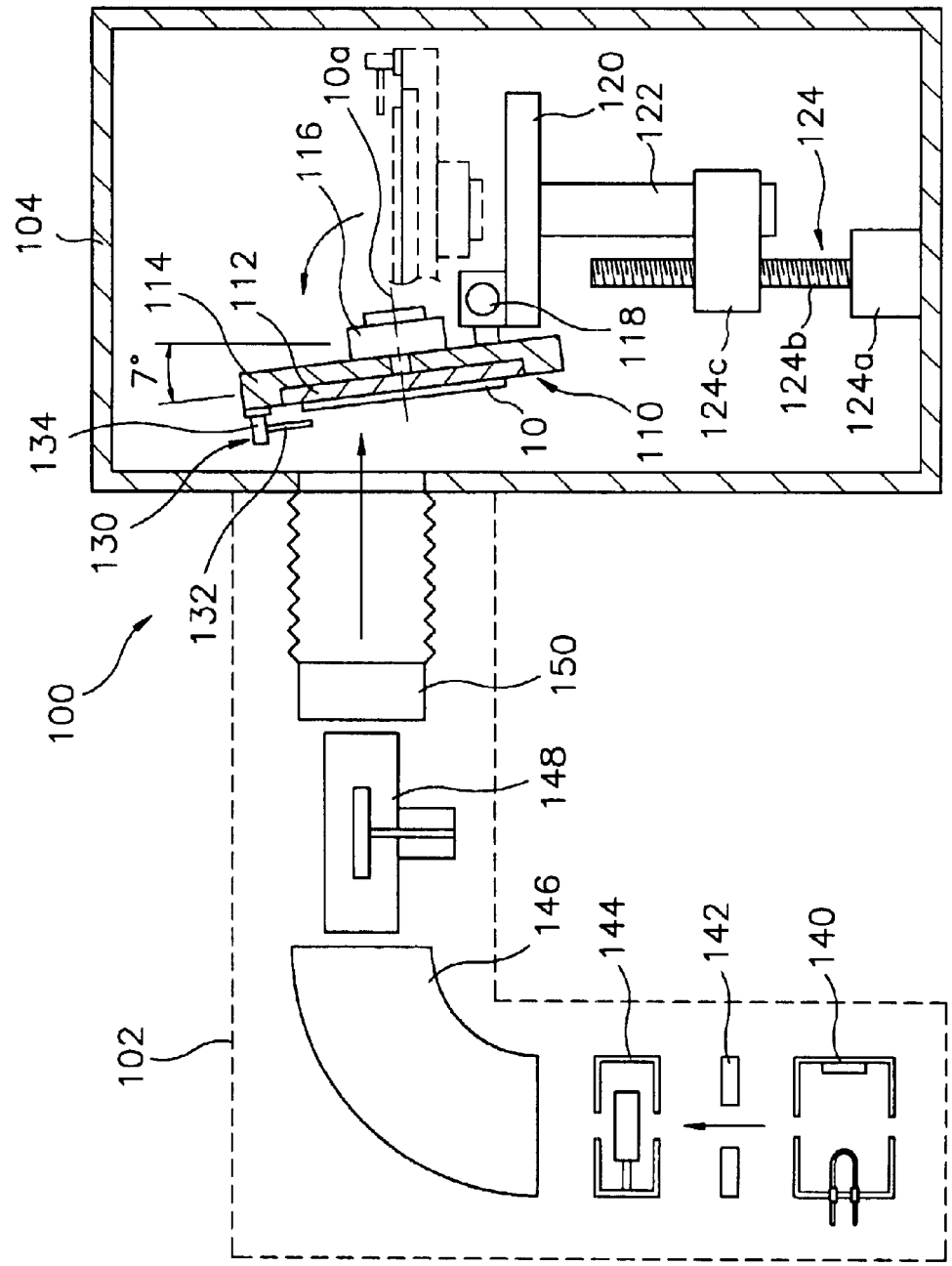
FIG. 3 illustrates a schematic, partially cross-sectional view of an ion implanter for performing the exemplary embodiment as shown in FIG. 1.

FIG. 3 illustrates a schematic, partial cross-sectional view of an ion implanter for performing the exemplary embodiment as shown in FIG. 1.

Referring to FIG. 3, an ion implanter 100 includes an ion source 102 for supplying an ion beam composed of ions, and an ion implantation chamber 104 connected to the ion source 102 for performing an ion implantation process.

A chuck 110 for supporting a semiconductor substrate 10 is disposed in the ion implantation chamber 104. The chuck 110 includes a platen 112 for holding the semiconductor substrate 10, and a supporting member 114 for supporting the platen 112.

The platen 112 has a disc shape. A groove for receiving the platen 112 is formed in one side of the supporting member 114. A first driving unit 116 for rotating the platen 112 is connected to a central portion of the platen 112 through the supporting member 114. The first driving unit 116 is disposed at an opposite side of the supporting member 114 from the platen 112.

In addition, a second driving unit 118 for adjusting a tilted angle of the semiconductor substrate 10 is connected to the opposite side of the supporting member 114 from the platen 112. The second driving unit 118 is disposed on a base plate 120, and a driving shaft 122 and a third driving unit 124 for moving the chuck 110 in a vertical direction are connected to a bottom of the base plate 120.

The first and second driving units 116 and 118 can include a motor.

Preferably, a step motor to enable the rotating angle measurement of the step motor is used. The third driving unit 124 includes a motor 124a for supplying a rotating force, a ball screw 124b, and a ball nut 124c. However, various configurations of the third driving unit 124 may be employed for the present invention.

The semiconductor substrate 10 is loaded on the chuck 110 and is unloaded from the chuck 110 in a horizontal direction. During the ion implantation process, the semiconductor substrate 10 is tilted at a predetermined angle (e.g., a tilted angle of 7° with respect to a vertical plane) by the second driving unit 118. The first driving unit 116 rotates the semiconductor substrate 10 tilted at the predetermined tilted angle about a central axis 10a of the semiconductor substrate 10 so that an incidence angle of the ion beam irradiated toward the semiconductor substrate 10 is adjustable.

A shadow jig 130 is connected to the chuck 110 to intercept a portion of the ion beam irradiated from the ion source 102. The shadow jig 130 is connected to a peripheral portion of the supporting member 114, and the shadow jig 130 forms a shadow at a peripheral portion of the semiconductor substrate 10 held by the platen 112.

The shadow jig 130 includes a shadow bar 132 for intercepting the portion of the ion beam irradiated toward the semiconductor substrate 10 to form the shadow at the peripheral portion of the semiconductor substrate 10, and a bracket 134 for connecting the shadow bar 132 to the chuck 110 and for supporting the shadow bar 132. The shadow bar 132 extends from the bracket 134 toward a central portion of the semiconductor substrate 10 supported by the chuck 110. The shadow bar 132 does not extend beyond an EEW portion of the semiconductor substrate 10 supported by the chuck 110. The shadow bar 132 and the bracket 134 include a heat-resistant material, preferably a fluoric resin, such as TEFLON® resin (TEFLON® is the trade name for polytetra fluoroethylene).

The ion source 102 includes an ion generator 140 for generating ions from a source gas, an ion extractor 142 for extracting the ions from the ion generator 140 and for forming the ion beam, a charge exchanger 144 for converting a polarity of the ion beam formed by the ion extractor 142 from positive to negative, a mass analyzer 146 for selecting specific ions from the negative ion beam, an accelerator 148 for accelerating the negative ion beam composed of the specific ions and for converting the negative ion beam into a positive ion beam, a focusing magnet (not shown) for focusing the positive ion beam accelerated by accelerator 148 onto the semiconductor substrate 10, an ion deflector 150 for adjusting an advancing direction of the focused ion beam directed from the focusing magnet, and an ion current measurement section (not shown) for measuring an ion current of the ion beam.

The ion generator 140 includes an arc discharge type ion generator. The arc discharge type ion generator includes an arc chamber and a filament. The source gas collides with thermoelectrons discharged from the filament to generate ions. In addition, the ion generator 140 can include an ion generator of various types, such as a radio frequency type, a duoplasmatron type, a cold cathode type, a sputter type, or a penning ionization type.

The charge exchanger 144 includes solid magnesium, which is used as an electron supply material, and a heater. The heater heats the solid magnesium to a temperature of approximately 450° C. so that gaseous magnesium molecules are generated from the solid magnesium. The ion beam extracted by the ion extractor 142 collides with the gaseous magnesium molecules. Then, the ion beam receives electrons from the gaseous magnesium molecules and consequently acquires a negative net charge.

The mass analyzer 146 selects the specific ions from the negative ion beam. The negative ion beam composed of the specific ions is then directed in the accelerator 148.

The accelerator 148 includes a first accelerating section and a second accelerating section. A stripper for converting the polarity of the ion beam from negative to positive is disposed between the first accelerating section and second accelerating section. The negative ion beam accelerated by the first accelerating section is converted into the positive ion beam by the stripper. The positive ion beam is then accelerated by the second accelerating section. The accelerator 148 is supplied with a high voltage of thousands to millions of volts. A stripping gas for converting the polarity of the ion beam includes nitrogen gas and argon gas.

The focusing magnet focuses the ion beam accelerated by the accelerator 148 onto the semiconductor substrate 10. The ion deflector 150 adjusts the advancing direction of the focused ion beam so that the focused ion beam entirely scans the semiconductor substrate 10.

The positive ion beam converted by the stripper includes a great number of ions charged with various energy levels. The ion source 102 further includes an ion filter (not shown) for selecting specific ions from the positive ion beam according to the charge to mass ratios of the ions.

Though not illustrated in the figures, the ion current measurement section may include a first Faraday system disposed between the mass analyzer 146 and the accelerator 148 for measuring an ion current of the negative ion beam, and a second Faraday system disposed between the accelerator 148 and the ion implantation chamber 104 for measuring an ion current of the positive ion beam.

In operation, when the shadow jig 130 is fixed on the chuck 110, it is difficult to load and unload the semiconductor substrate 10 from the chuck 110. Accordingly, the shadow jig 130 should be movably connected to the chuck 110. A fourth driving unit for moving the shadow jig 130 is required to provide this moveable connection.

Figure 4:
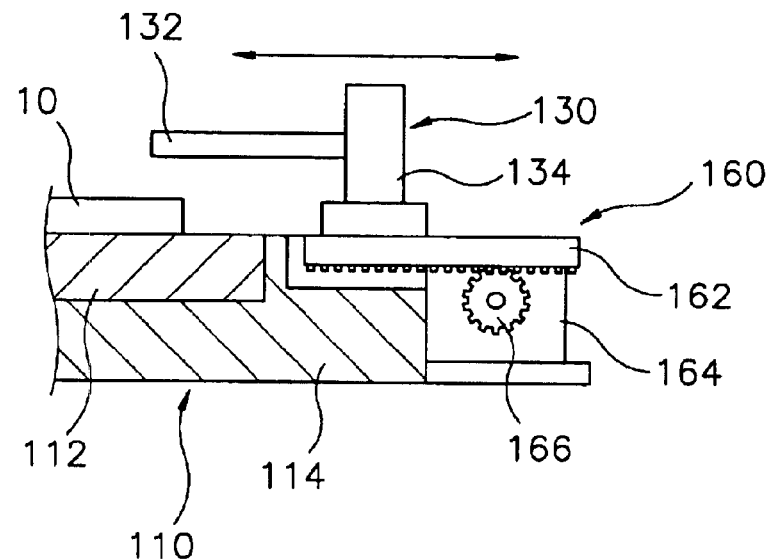
FIG. 4 illustrates an enlarged cross-sectional view of a fourth driving unit.
Figure 5:
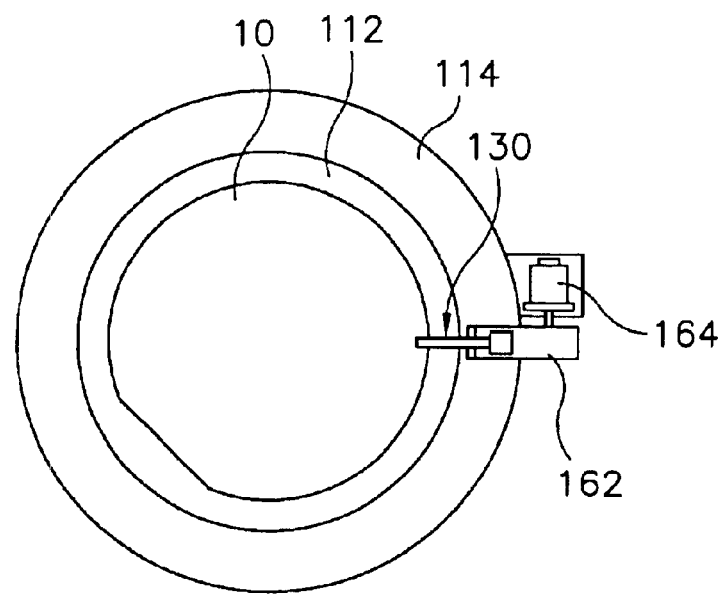
FIG. 5 illustrates a plan view of the fourth driving unit as shown in FIG. 4.

FIG. 4 illustrates an enlarged cross-sectional view of a fourth driving unit. FIG. 5 illustrates a plan view of the fourth driving unit as shown in FIG. 4.

Referring to FIGS. 4 and 5, the fourth driving unit 160 includes a rack 162 movably connected to the supporting member 114, a motor 164 for supplying a driving force, and a pinion 166 for connecting the rack 162 and the motor 164. The bracket 134 of the shadow jig 130 is disposed on an upper surface of the rack 162. The shadow bar 132 extends from the bracket 134 toward a central portion of the platen 112. A guide groove for guiding the rack 162 is formed in an upper portion of the supporting member 114. In operation, the rack 162 is engaged with the pinion 166, and the pinion 166 reciprocates the rack 162 in the guide groove.

When the semiconductor substrate 10 is loaded on the platen 112, the fourth driving unit 160 moves the shadow jig 130 away from the central portion of the chuck 110 to prevent interference between the semiconductor substrate 10 and the shadow jig 130. Then, after the semiconductor substrate 10 has been loaded on the platen 112, the fourth driving unit 160 moves the shadow jig 130 toward the central portion of the chuck 110. At this time, an end of the shadow jig 130 should not extend beyond the EEW portion of the semiconductor substrate 10 supported by the chuck 110.

Figure 6:
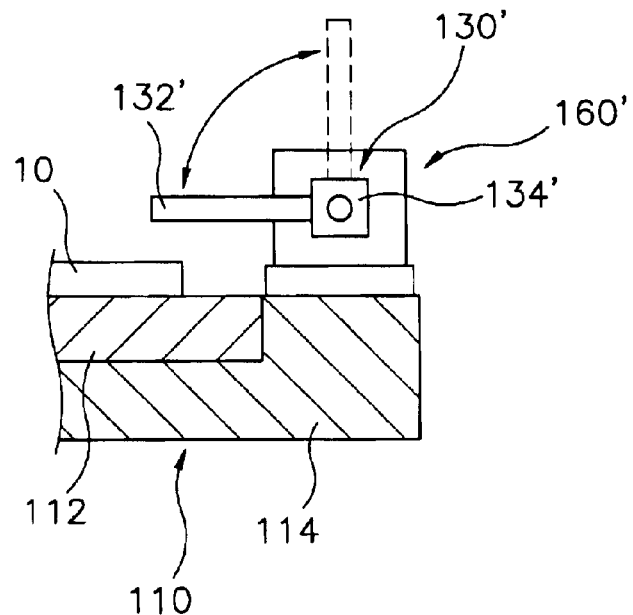
FIG. 6 illustrates an enlarged, cross-sectional view of an alternate embodiment of a fourth driving unit.
Figure 7:
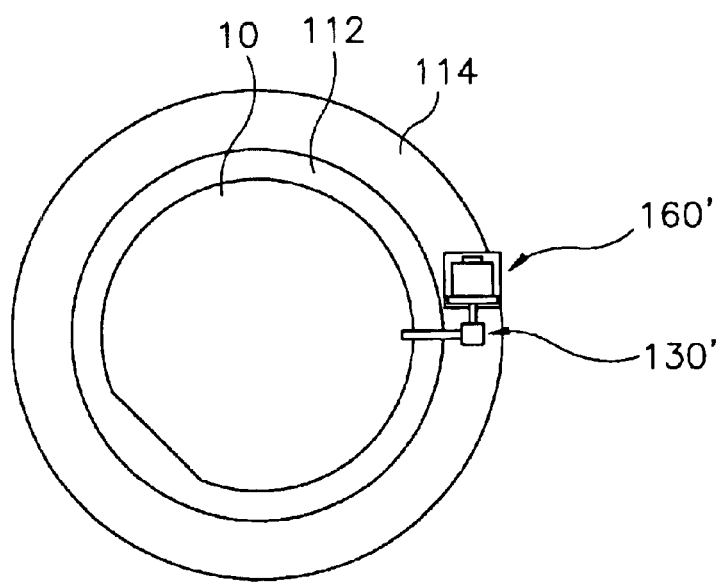
FIG. 7 illustrates a plan view of the alternate embodiment of the fourth driving unit as shown in FIG. 6.

FIG. 6 illustrates an enlarged cross-sectional view of an alternate embodiment of a fourth driving unit. FIG. 7 illustrates a plan view of the alternate embodiment of the fourth driving unit as shown in FIG. 6.

Referring to FIGS. 6 and 7, a fourth driving unit 160' includes a motor for rotating a shadow jig 130'. The fourth driving unit 160' is disposed at a peripheral portion of an upper surface of the supporting member 114 and is connected to a bracket 134' of the shadow jig 130'. A shadow bar 132' extends from the bracket 134' toward the central portion of the platen 112.

When the semiconductor substrate 10 is loaded on the platen 112, the fourth driving unit 160' rotates the shadow jig 130' in the vertical direction in order to prevent interference between the semiconductor substrate 10 and the shadow jig 130'. Then, after the semiconductor substrate 10 has been loaded on the platen 112, the fourth driving unit 160' rotates the shadow jig 130' back in the horizontal direction. At this time, an end of the shadow bar 132' should not extend beyond the EEW portion of the semiconductor substrate 10 held by the platen 112.

Experiment

In order to evaluate the effectiveness of the present invention, an ion implanter was equipped with a shadow jig having a width of 4 mm and a height of 4 mm. A semiconductor substrate was tilted to a tilted angle of approximately 7° with respect to the vertical plane, and a width of a shadow formed by the shadow jig was approximately 4.5 mm.

Figure 8:
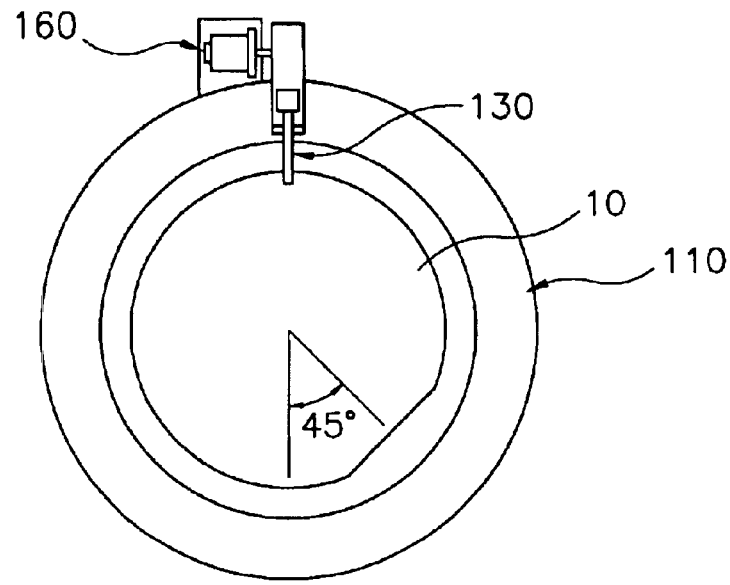
FIG. 8 illustrates a schematic view of the formation of a first shadow on a semiconductor substrate.
Figure 9:
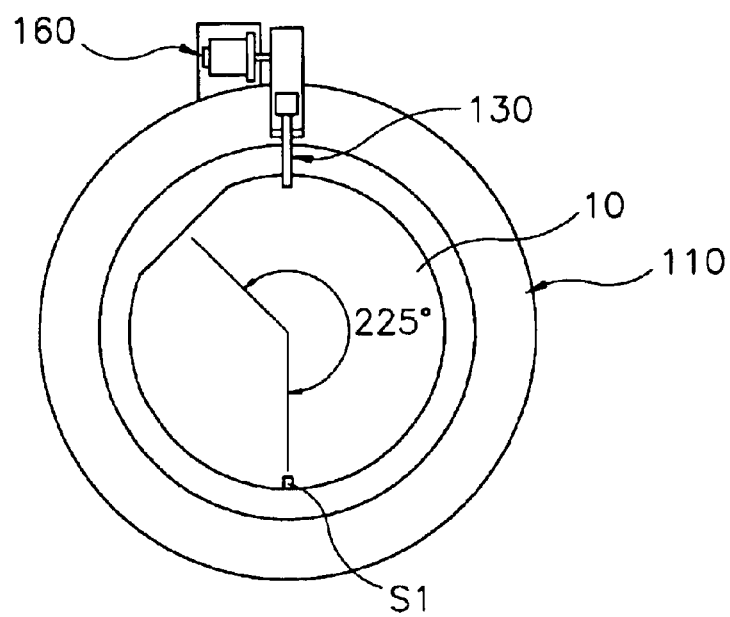
FIG. 9 illustrates a schematic view of the formation of a second shadow on a semiconductor substrate.
Figure 10:
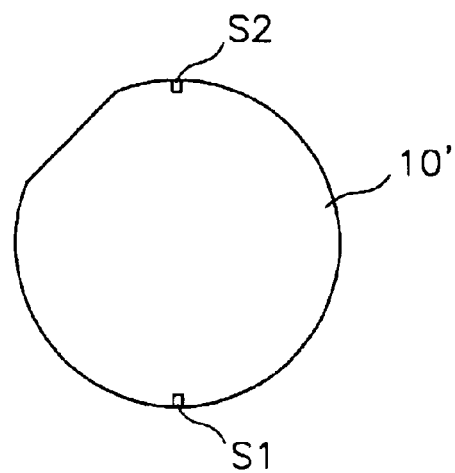
FIG. 10 illustrates a plan view of a semiconductor substrate having the first and second shadows formed by a normal ion implanter.
Figure 11:
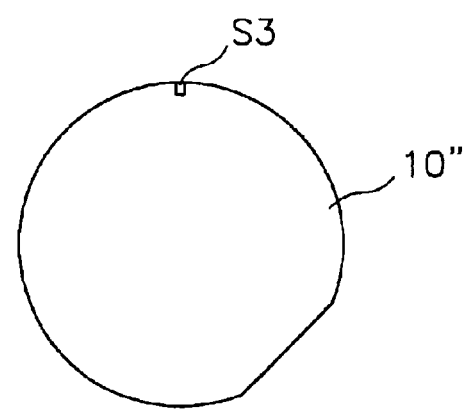
FIG. 11 illustrates a plan view of a semiconductor substrate having a third shadow formed by an abnormal ion implanter.
Figure 12:
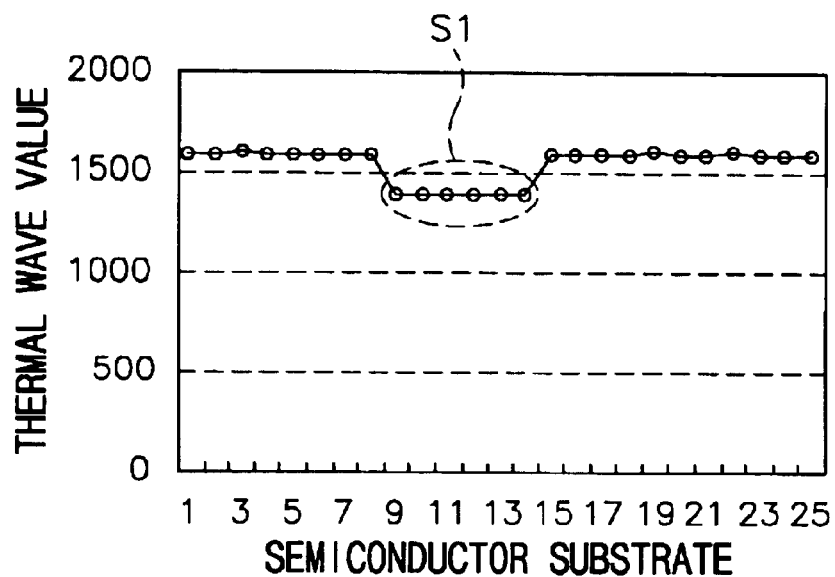
FIG. 12 is a chart showing a first thermal wave value corresponding to the first shadow formed by the normal ion implanter.
Figure 13:
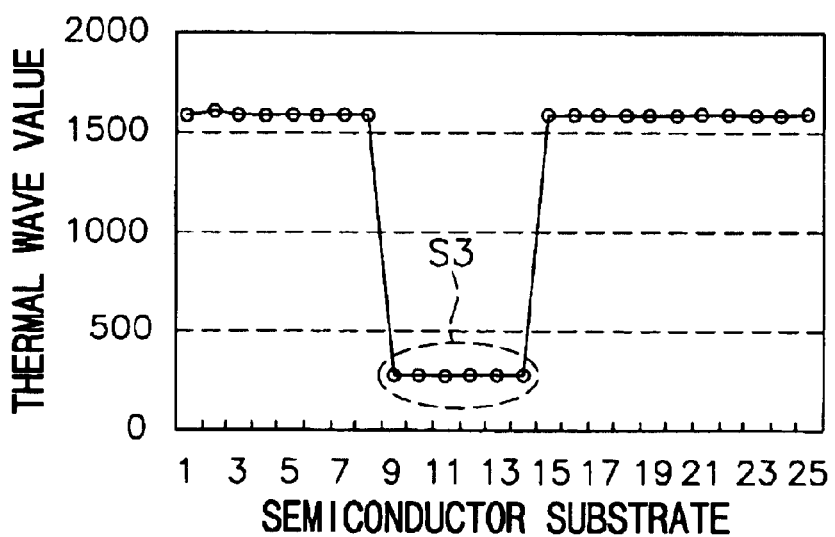
FIG. 13 is a chart showing a third thermal wave value corresponding to the third shadow formed by the abnormal ion implanter.

FIG. 8 illustrates a schematic view of a step of forming a first shadow on a semiconductor substrate. FIG. 9 illustrates a schematic view of a step of forming a second shadow on the semiconductor substrate. FIG. 10 illustrates a plan view of a semiconductor substrate having the first and second shadows formed by a normal ion implanter. FIG. 11 illustrates a plan view of a semiconductor substrate having a third shadow formed by an abnormal ion implanter. FIG. 12 is a chart showing a first thermal wave value corresponding to the first shadow formed by the normal ion implanter. FIG. 13 is a chart showing a third thermal wave value corresponding to the third shadow formed by the abnormal ion implanter.

Referring to FIGS. 8 to 10, a first shadow S1 and a second shadow S2 were formed on the semiconductor substrate by normally rotating the semiconductor substrate 10. A first rotating angle of the semiconductor substrate 10 held by the chuck 110 was 45° during a primary ion implantation process for forming the first shadow S1. A second rotating angle of the semiconductor substrate 10 held by the chuck 110 was 225° during a secondary ion implantation process for forming the second shadow S2. At this time, a datum point was a central point of a flat zone.

Referring now to FIG. 10, the first shadow S1 and the second shadow S2 were formed on a semiconductor substrate 10' subjected to a normal ion implantation process. Though the first shadow S1 and the second shadow S2 are illustrated in FIG. 10, the first shadow S1 and the second shadow S2 are really invisible to the naked eye. A first thermal wave value corresponding to the first shadow S1 was measured by a thermal probe apparatus, and the measured first thermal wave value is illustrated in FIG. 12.

Referring now to FIG. 11, a third shadow S3 was formed on a semiconductor substrate 10" subjected to an abnormal ion implantation process. That is, the primary and the secondary ion implantation processes were performed on the semiconductor substrate 10" having the rotating angle of 45°. A third thermal wave value corresponding to the third shadow S3 was measured by the thermal probe apparatus, and the measured third thermal wave value is illustrated in FIG. 13.

First ions composing the first ion beam are implanted into a second portion of the semiconductor substrate (10' of FIG. 10) corresponding to the second shadow S2 during the primary ion implantation process, and then second ions composing the second ion beam are implanted into a first portion of the semiconductor substrate 10' corresponding to the first shadow S1 during the secondary ion implantation process. On the contrary, the first and second ions are not implanted into a third portion of the semiconductor substrate (10" of FIG. 11) corresponding to the third shadow S3 during the primary and the secondary ion implantation processes. Consequently, the first thermal wave value corresponding to the first shadow S1 is significantly higher than the third thermal wave value corresponding to the third shadow S3, as shown in FIGS. 12 and 13. Accordingly, whether the rotation of the semiconductor substrate is normally performed can be easy monitored.

According to the present invention, a shadow jig forms a shadow on a semiconductor substrate by intercepting a portion of an ion beam irradiated toward the semiconductor substrate. Whether the rotation of the semiconductor substrate has been normally performed can be monitored by comparing the thermal wave value corresponding to the shadow with a reference thermal wave value.

Accordingly, a defect in the ion implantation process may be prevented in advance, and a failure of the ion implanter may be rapidly repaired. In addition, the loss of time and materials can be reduced and the productivity of the semiconductor device can be increased.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for monitoring an ion implanter, comprising:
   positioning a substrate behind an interceptor for intercepting a portion of an ion beam to be irradiated toward the substrate;
   irradiating a first ion beam toward the substrate to form a first shadow on the substrate;
   rotating the substrate about a central axis of the substrate;
   irradiating a second ion beam toward the substrate to form a second shadow on the substrate; and
   measuring a dosage of ions implanted into the substrate to monitor whether the rotation of the substrate has been normally performed.

2. The method for monitoring an ion implanter as claimed in claim 1, wherein the ion beam is irradiated toward the substrate in a horizontal direction, and the substrate is tilted at a predetermined angle with respect to an advancing direction of the ion beam.

3. The method for monitoring an ion implanter as claimed in claim 2, wherein the semiconductor substrate is tilted at an angle of approximately 7° with respect to a vertical plane, and an incidence angel of the ion beam is approximately 83° with respect to the semiconductor substrate.

4. The method for monitoring an ion implanter as claimed in claim 1, wherein the dosage of ions implanted into the substrate is measured using a method selected from the group consisting of: measuring a thermal wave value of a surface of the semiconductor substrate, an image analysis method using a scanning electron microscope, an ingredient analysis method using a particle analyzing system, and an energy analysis method measuring a surface resistance of the semiconductor substrate.

5. The method for monitoring an ion implanter as claimed in claim 1, wherein the dosage of ions implanted into the substrate is measured using a method of measuring a thermal wave value of a surface of the semiconductor substrate.

6. The method for monitoring an ion implanter as claimed in claim 1, wherein the ion beam scans the substrate in a horizontal direction, and the substrate moves in a vertical direction according to a scanning of the ion beam during a formation of the first and second shadows.

7. The method for monitoring an ion implanter as claimed in claim 1, wherein the ion beam has a cross-section shape of a ribbon, the ion beam is irradiated in a horizontal direction, and the substrate moves in a vertical direction so that the ion beam entirely scans the substrate.

8. The method for monitoring an ion implanter as claimed in claim 1, wherein the ion beam has a cross-section shape of a ribbon and scans the semiconductor substrate in a vertical direction.

9. The method for monitoring an ion implanter as claimed in claim 1, wherein rotating the substrate about a central axis of the substrate comprises rotating the semiconductor substrate about a central axis by an angle of approximately 180°.

10. The method for monitoring an ion implanter as claimed in claim 1, wherein the first and second shadows are formed at a peripheral portion of the substrate.

11. A method for monitoring an ion implanter, comprising:
    interposing an interceptor for intercepting a portion of an ion beam to be irradiated toward a substrate between the substrate and an ion source for irradiating the ion beam;
    irradiating a first ion beam toward the substrate to form a first shadow on the substrate;
    rotating the substrate about a central axis of the substrate;
    irradiating a second ion beam toward the substrate to form a second shadow on the substrate; and
    measuring a dosage of ions implanted into the substrate to monitor whether the rotation of the substrate has been normally performed.

12. The method for monitoring an ion implanter as claimed in claim 11, wherein the substrate is tilted at a predetermined angle with respect to an advancing direction of the ion beam.

13. The method for monitoring an ion implanter as claimed in claim 11, wherein the semiconductor substrate is tilted at an angle of approximately 7° with respect to a vertical plane, and an incidence angel of the ion beam is approximately 83° with respect to the semiconductor substrate.

14. The method for monitoring an ion implanter as claimed in claim 11, wherein the dosage of ions implanted into the substrate is measured using a method selected from the group consisting of: measuring a thermal wave value of a surface of the semiconductor substrate, an image analysis method using a scanning electron microscope, an ingredient analysis method using a particle analyzing system, and an energy analysis method measuring a surface resistance of the semiconductor substrate.

15. The method for monitoring an ion implanter as claimed in claim 11, wherein the dosage of ions implanted into the substrate is measured using a method of measuring a thermal wave value of a surface of the semiconductor substrate.

16. The method for monitoring an ion implanter as claimed in claim 11, wherein the first and second shadows are formed at a peripheral portion of the substrate.

17. The method for monitoring an ion implanter as claimed in claim 11, wherein rotating the substrate about a central axis of the substrate comprises rotating the semiconductor substrate about a central axis by an angle of approximately 180°.

18. A method for monitoring an ion implanter, comprising:
   interposing an interceptor for intercepting a portion of an ion beam to be irradiated toward a substrate between the substrate and an ion source for irradiating the ion beam, the substrate being tilted at a predetermined angle with respect to an advancing direction of the ion beam;
   irradiating a first ion beam toward the substrate to form a first shadow on the substrate;
   rotating the substrate about a central axis of the substrate with maintenance of the tilted angle;
   irradiating a second ion beam toward the substrate to form a second shadow on the substrate;
   measuring a thermal wave value of a surface of the substrate; and
   comparing a first thermal wave value corresponding to the first shadow with a reference thermal wave value to monitor whether the rotation of the substrate has been normally performed.

19. The method for monitoring an ion implanter as claimed in claim 18, wherein the reference thermal wave value is a thermal wave value obtained through a normal ion implantation process.

20. The method for monitoring an ion implanter as claimed in claim 18, wherein the reference thermal wave value is a thermal wave value obtained through an abnormal ion implantation process.

21. The method for monitoring an ion implanter as claimed in claim 18, wherein the first and second shadows are formed at an edge exposure of wafer (EEW) portion of the substrate.

22. The method for monitoring an ion implanter as claimed in claim 18, wherein a size of the first and second shadows is variable according to a size of the shadow jig.

23. The method for monitoring an ion implanter as claimed in claim 11, wherein monitoring the rotation of the semiconductor substrate is performed by either a scanning electron microscope or a particle analyzing system.

24. An ion implanter, comprising:
   an ion source for irradiating an ion beam toward a substrate;
   an ion implantation chamber connected to the ion source for performing an ion implantation process on the substrate;
   a chuck disposed in the ion implantation chamber for supporting the substrate, which is tilted at a predetermined angle with respect to an advancing direction of the ion beam;
   a first driving unit for rotating the substrate about a central axis of the substrate in order to change an incidence angle of ion beam; and
   a shadow jig for intercepting a portion of the ion beam in order to form a shadow on the substrate during the ion implantation process, wherein the shadow is formed to monitor whether the substrate has been normally rotated during the ion implantation process.

25. The ion implanter as claimed in claim 24, wherein the ion source comprises:
   an ion generator for generating ions from a source gas;
   an ion extractor for extracting the ions from the ion generator and for forming the ion beam;
   a charge exchanger for converting a polarity of the ion beam formed by the ion extractor from positive to negative;
   a mass analyzer for selecting specific ions from the negative ion beam;
   an accelerator for accelerating the negative ion beam composed of the specific ions and for converting the negative ion beam into a positive ion beam; and
   an ion deflector for adjusting an advancing direction of the ion beam.

26. The ion implanter as claimed in claim 24, wherein the ion generator is a type of ion generator selected from the group consisting of: an arc discharge type, a radio frequency type, a duoplasmatron type, a cold cathode type, a sputter type, and a penning ionization type.

27. The ion implanter as claimed in claim 24, wherein the semiconductor substrate is tilted at an angle of approximately 7° with respect to a vertical plane, and an incidence angel of the ion beam is approximately 83° with respect to the semiconductor substrate.

28. The ion implanter as claimed in claim 24, wherein the first driving unit comprises a step motor.

29. The ion implanter as claimed in claim 24, further comprising a second driving unit for adjusting the angle at which the substrate is tilted.

30. The ion implanter as claimed in claim 24, further comprising a second driving unit for moving the chuck in a vertical direction.

31. The ion implanter as claimed in claim 24, wherein the chuck includes a platen for holding the substrate using an electrostatic force, and a supporting member for supporting the platen.

32. The ion implanter as claimed in claim 31, wherein the platen has a disc shape.

33. The ion implanter as claimed in claim 24, wherein the shadow jig includes a shadow bar for forming the shadow at a peripheral portion of the substrate, and a bracket for supporting the shadow bar.

34. The ion implanter as claimed in claim 33, wherein the shadow bar only extends over an edge exposure of wafer (EEW) portion of the semiconductor substrate.

35. The ion implanter as claimed in claim 33, further comprising a second driving unit connected to the bracket for moving the shadow jig, wherein the second driving unit moves the shadow jig away from a central portion of the chuck while the substrate is loaded on or unloaded from the chuck, and the second driving unit moves the shadow jig toward a central portion of the chuck for forming the shadow on the substrate during the ion implantation process.

36. The ion implanter as claimed in claim 35, wherein the second driving unit comprises:

a rack movably connected to a supporting member for supporting a platen that holds the substrate;

a motor for supplying a driving force; and a pinion for connecting the rack and the motor.

37. The ion implanter as claimed in claim 36, wherein the supporting member comprises a guide groove for guiding the rack in an upper portion thereof.

38. The ion implanter as claimed in claim 24, wherein the shadow jig comprises a heat-resistant material.

39. The ion implanter as claimed in claim 38, wherein the heat-resistant material is fluoric resin.

40. The ion implanter as claimed in claim 33, further comprising a second driving unit connected to the bracket for moving the shadow jig, wherein the second driving unit rotates the shadow jig in the vertical direction while the substrate is loaded on or unloaded from the chuck, and the second driving unit rotates the shadow jig back in the horizontal direction for forming the shadow on the substrate during the ion implantation process.

* * * * *